United States Patent
Lanning

[11] 3,943,350
[45] Mar. 9, 1976

[54] RADIX CONVERTER UTILIZING AUTOMATA

[75] Inventor: Walter C. Lanning, Plainview, N.Y.

[73] Assignee: Sperry Rand Corporation, New York, N.Y.

[22] Filed: Oct. 18, 1974

[21] Appl. No.: 515,931

[52] U.S. Cl. ........................... 235/155; 340/347 DD
[51] Int. Cl.² ....................................... H03K 13/24
[58] Field of Search....... 340/347 DD; 235/154, 155

[56] References Cited
UNITED STATES PATENTS
3,758,766  9/1973  Combet........................ 340/347 DD OTHER PUBLICATIONS
Isberg, "IBM Technical Disclosure Bulletin" Vol. 8, No. 1, June 1965, pp. 80–81.
Dean, "Electronic Engineering" Dec. 1968, pp. 694–697.

*Primary Examiner*—Charles D. Miller
*Attorney, Agent, or Firm*—Howard P. Terry; Albert B. Cooper

[57] ABSTRACT

A radix converter comprises a plurality of automata each of combined Moore and Mealy design. The automata are connected in cascade with the digits of the input number applied serially to one of the automata. The Moore output of each automaton stage is utilized to provide the final state of the stage and is representative of a respective coefficient of the number in the transformed radix. The Mealy output of each stage is an untransformed residue transferred to the next identically designed automaton circuit. For numbers of integral value each automaton operates in accordance with the equation:

$$\frac{(S) \, r_a + I_0(r_a)^0}{r_b} = Z + S^* \bmod r_b$$

For numbers of fractional value each automaton is instrumented in accordance with the equation:

$$\frac{S}{r_a} + I_{-1} \, (r_a)^{-1} \, r_b = S^* + Z \bmod r_a$$

Where in the above equations: $S$ = Present state of the stage
$S^*$ = Next state of the stage
$r_a$ = Current radix
$r_b$ = Desired radix
$Z$ = Mealy output to the next stage
$I_0 \, (r_a)^0$ = Weighted input or residue digit in integral number conversion
$I_{-1} \, (r_a)^{-1}$ = Weighted input or residue digit in fractional number conversion
$S_f$ = Final state of the stage

6 Claims, 18 Drawing Figures

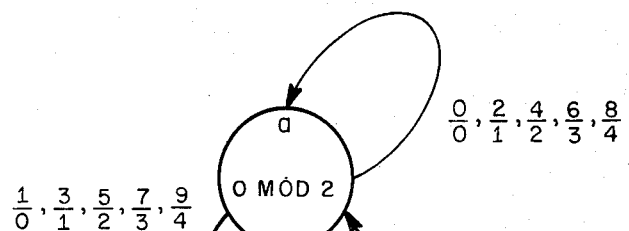
FIG. 2.
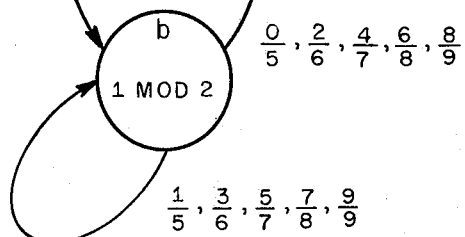
FIG. 3.
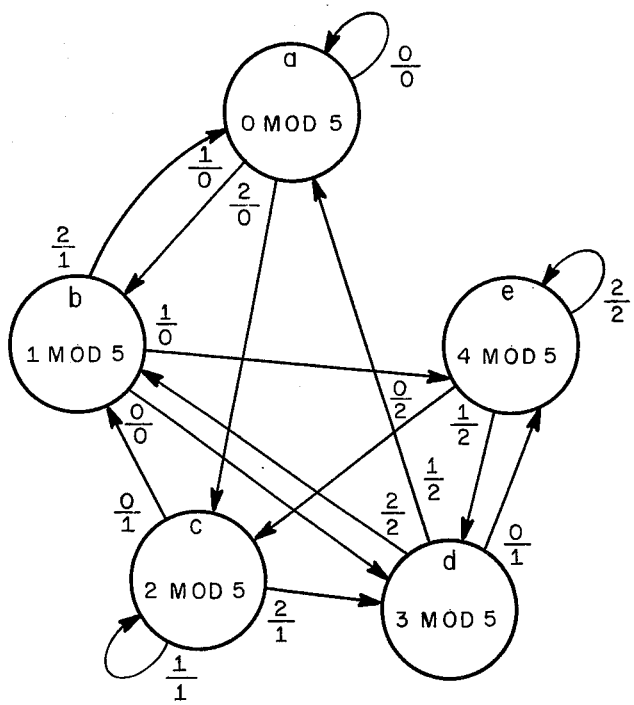
FIG. 4.
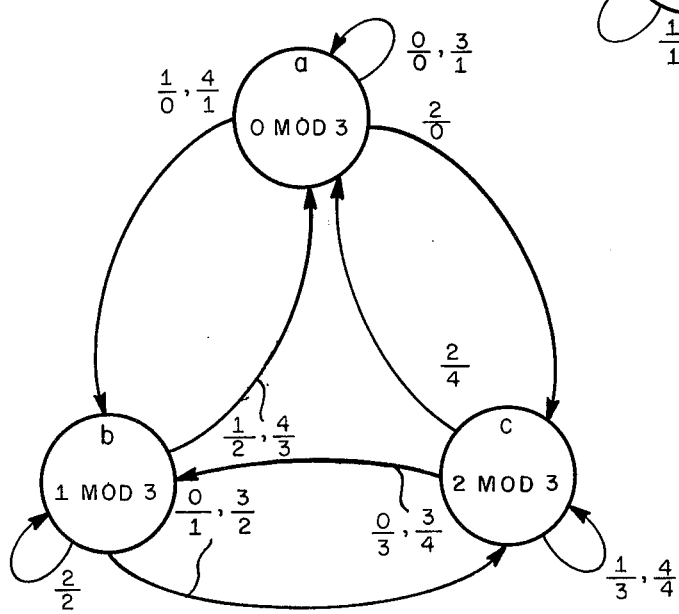

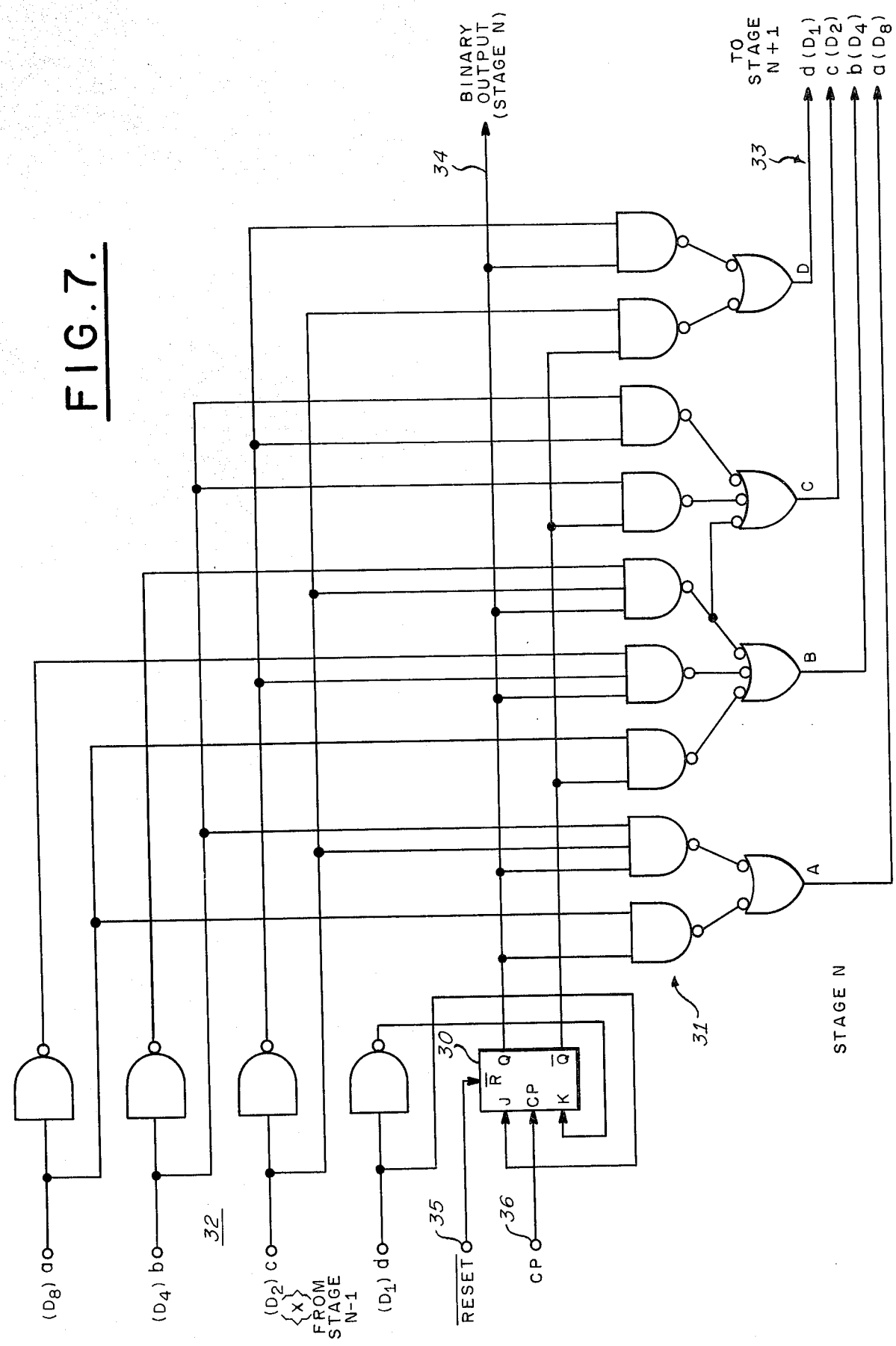

RADIX CONVERTER UTILIZING AUTOMATA

BACKGROUND OF THE INVENTION

1. Field of the Invention

The invention is concerned with radix converters and is particularly designed utilizing automata.

2. Description of the Prior Art.

In digital computer systems when a data entry and display panel is located remotely from the computer, generally the decimal information to and from the panel is transmitted serially in the form of binary coded deciman digits. Radix conversion to and from the required binary base is often performed by the software of the computer necessitating utilizing expensive computer time as well as memory space for the requisite programs. Alternatively the data panel is at times designed to utilize a base 8 radix for the entry and display of the data avoiding the necessity for software radix conversion but resulting in increased computer operator difficulty.

Hardware radix converters have been utilized in the prior art but these have generally been expensive because heretofore there hadn't been any simple logical relationship between the binary and binary coded decimal codes. The prior art hardware radix converters normally utilized both decimal and binary counters, adders, shift registers and translation matrices which achieved the radix conversion in an indirect manner. These prior art implementations are normally dependent on the length of the numbers to be converted and generally did not provide a meaningful result until all of the digits of the number to be transformed had been applied to the converter. Many of these prior art devices required high speed clocks relative to the system basic bit clock for time subdivision.

SUMMARY OF THE INVENTION

The present invention overcomes the aforedescribed disadvantages of prior art radix converters by utilizing one or a plurality of identical modular logic circuits or automata where the plurality of automata are connected as cascade stages with the digits of the input number to be converted applied serially to one of the stages. Each automation is of combined Moore and Mealy design of which the final state of the stage provides the Moore output representative of a coefficient of the transformed number and the Mealy output provides a untransformed residue transferred to the next identically designed stage. For conversion of numbers having integral values each automaton stage operates in accordance with the following equation:

$$\frac{(S) r_a + I_0(r_a)^0}{r_b} = Z + S \bmod r_b$$

For the conversion of numbers of fractional value each automaton operates in accordance with the following equation:

$$\frac{S}{r_a} + I_{-1}(r_a)^{-1} r_b = S + Z \bmod r_a$$

Where in the above equations:

$S$ = Present state of the stage
$S$ = Next state of the stage
$r_a$ = Current radix
$r_b$ = Desired radix
$Z$ = Mealy output to the next stage
$I_0 (r_a)^0$ = Weighted input or residue digit in integral number conversion
$I_{-l} r_a)^{-l}$ = Weighted or input residue digit in fractional number conversion
$S_f$ = Final state of the stage

BRIEF DESCRIPTION OF THE DRAWINGS

FIG. 2 is a state diagram for a radix 10 to radix 2 automaton for integral number conversion;

FIG. 3 is a state diagram for a radix 3 to radix 5 automaton for integral number conversion;

FIG. 4 is a state diagram for a radix 5 to radix 3 automaton for integral number conversion;

FIG. 7 is a logic block diagram of a radix 10 to radix 2 automaton in accordance with the state diagram of FIG. 2;

DESCRIPTION OF THE PREFERRED EMBODIMENT

Figure 1:
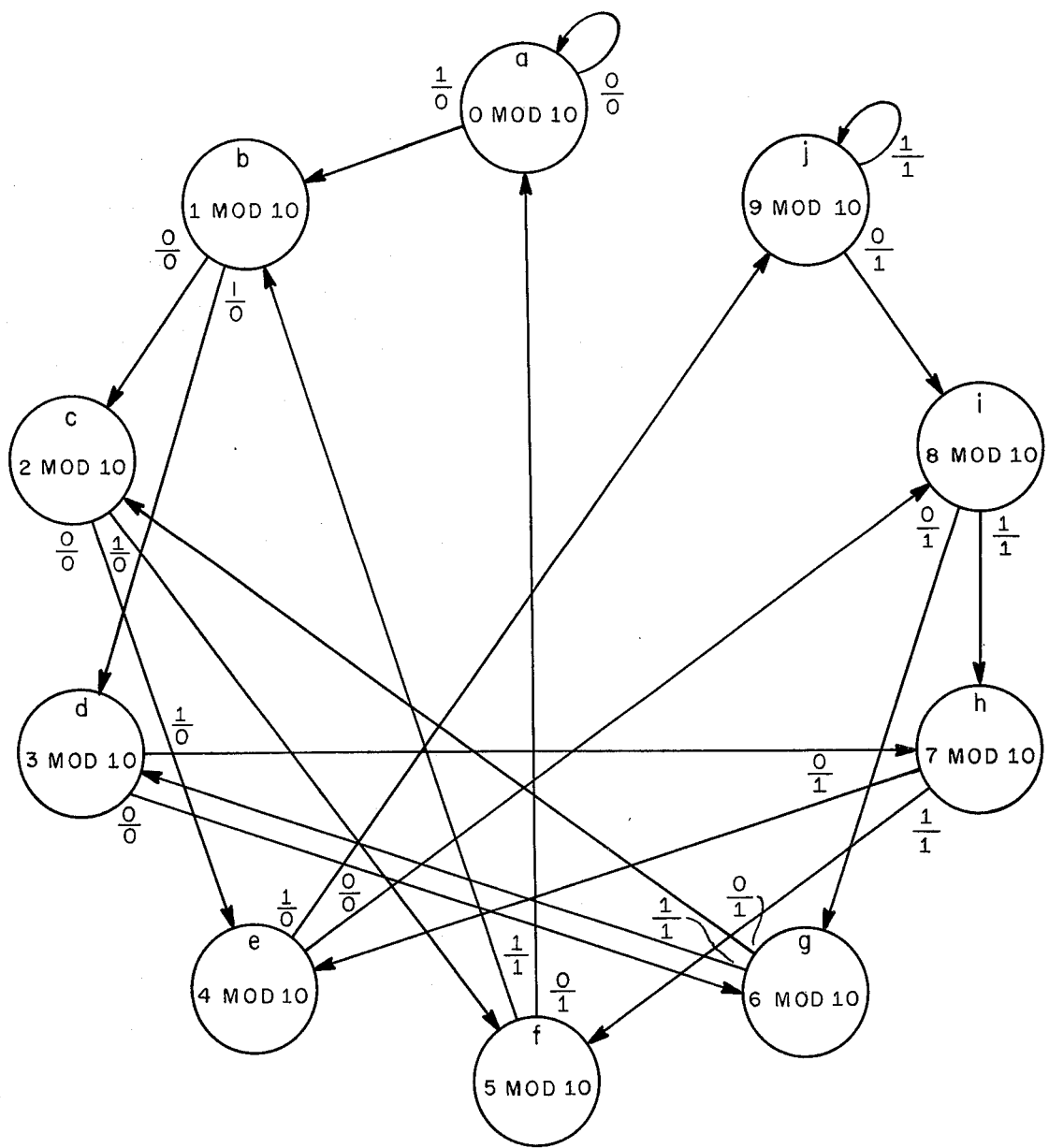
FIG. 1 is a state diagram for a radix 2 to radix 10 automaton for integral number conversion.

In order to facilitate an understanding of the structure and scope of the invention the underlying theory and development thereof will first be explained. A known method of radix conversion for integral numbers is repeated division by the desired radix with each remainder being a coefficient of the transformed number. For example, to transform the radix 7 number 140 into a radix 3 number, the following procedure is utilized:

```
3  |140
3   |34  (R=2)     b₀ = 2
3   |11  (R=1)     b₁ = 1
3    |2  (R=2)     b₂ = 2
```

-continued 0 (R=2)     $b_3 = 2$

Thus the number 140 in radix 7 is equivalent to 2212 in radix 3. The divisor 3 is a base 7 number and the division process is a base 7 operation.

Similarly a conventional radix conversion procedure for fractional numbers utilizes repeated multiplications by the desired radix with each overflow integer being a coefficient of the transformed number. For example, 0.14 in radix 7 is transformed to a radix 3 number in the following manner:

| | |
|---|---|
| $0.14 \times 3 = 0.45$ | $b_{-1} = 0$ |
| $0.45 \times 3 = 2.01$ | $b_{-2} = 2$ |
| $0.01 \times 3 = 0.03$ | $b_{-3} = 0$ |
| $0.03 \times 3 = 0.12$ | $b_{-4} = 0$ |
| $0.12 \times 3 = 0.36$ | $b_{-5} = 0$ |
| $0.36 \times 3 = 1.44$ | $b_{-6} = 1$ |

Thus, 0.14 in radix 7 is equivalent to 0.020001 . . . in radix 3. Again the multiplier 3 is a base 7 number and the multiplication process is a base 7 operation.

In accordance with the development of the present invention sequential logic theory is applied to the above conversion procedures to develop respective automata for instrumenting radix converters in accordance with the present invention. An appreciation of the precepts of sequential logic theory and automata theory may be had from the textbook "Switching and Finite Automata Theory" by Zvi Kohavi published by McGraw-Hill Book Company in 1970. A further appreciation for the discipline of sequential logic theory may be had from the textbook "Finite State Models for Logical Machines" by F. C. Hennie, published by John Wiley and Sons, Inc. in 1968.

Applying automata theory to the integral number conversion procedure a plurality of identical automata are utilized, one for each of the coefficients of the transformed number. The digits of the number to be transformed are applied serially to one of the automaton stages, most significant digit first. The automata are connected in cascade fashion. Considering the conversion method as it would be performed by the first automaton stage after starting with the most significant digit of the number to be converted, the digits accumulated to the present time are shifted left, summed with the incoming digit and then divided by the desired radix. The integer portion of the quotient is transferred to the next automaton stage wherein the process is repeated thereon while the remainder or fractional portion of the quotient is retained. Considering the above given example of transforming the radix 7 number 140 into a radix 3 number, the first accumulation is 0. The 0 is shifted left, summed with the first incoming digit 1, and divided by 3 resulting in a quotient of 0+1 mod 3. The 0 is transferred to the next stage and the 1 is retained. This 1 is shifted left, summed with the next incoming digit 4, and divided by 3 resulting in a quotient of 3 + 2 mod 3. As before, the integer 3 is transferred to the next stage and the fractional portion 2 is retained. Finally, the last cycle of the conversion results in a quotient of 4 + 2 mod 3. Thus the first transformed coefficient is $b_0 = 2$, and the integral number 34 has been transferred to the next stage that performs the above described process thereon.

Further, in accordance with the development of the invention, this process is transformed into an algorithm suitable for a sequential logic machine or automaton where the automaton is of combined Moore and Mealy design generally as discussed in the said Kohavi textbook. Consider the state of the machine to be the fractional part of the quotient and the Mealy output to be the integer transferred to the next stage which performs in identical fashion and consider the Moore output of the machine to be the final transformed coefficient for a specific digit. Finally, considering that a shift left operation is equivalent to multiplication by the radix, the following equation represents the algorithm for transforming an integral number from radix $a$ to radix $b$:

$$\frac{(S) r_a + I_0(r_a)^0}{r_b} = Z + S \bmod r_b \qquad (1)$$

where:
$S$ = Present state of the stage
$S$ = Next state of the stage
$r_a$ = Current radix
$r_b$ = Desired radix
$Z$ = Mealy output to the next stage
$I_0(r_a)^0$ = Weighted input or residue digit in integer conversion
$S_f$ = Final state of the stage
$S_v \oplus \lambda$ = Transformed final state which is the Moore output representing the transformed coefficient
$\oplus \lambda$ = a transformation operation performed on $S_f$ which in a manner to be described is rendered equal to unity in the preferred embodiment of the invention.

Now applying sequential logic theory to the conversion method given above for fractional numbers, again a plurality of cascade connected automata are utilized and the digits of the input number are serially applied to the first stage least significant digit first. In accordance with the development of the invention, the digits accumulated are shifted right and summed with the product of the incoming digit and the desired radix. The fractional portion of the product is transferred to the next stage and the integral portion is retained. In the example given above of transforming the radix 7 number 0.14 to a radix 3 number, the first accumulation 0 is shifted right and summed with the product of the incoming digit 0.4 and 3 resulting in a product of 1 + 5 mod 7. The 1 is retained and the 5 is transferred to the next stage. The 1 is shifted right, summed with the product of 0.1 and 3, resulting 0 + 4 mod 7. Thus the first coefficient $B_{-1} = 0$, the fractional portion 0.45 having been transferred to the next stage.

Further in the development of the present invention, this process is transformed into a algorithm suitable for a sequential logic machine by considering the state of the machine to be the integral part of the product, the Mealy output to be the fractional part transferred to the next stage which performs in identical fashion and the Moore output of the machine to be the final transformed coefficient for a specific digit. Finally, considering that a shift right operation is equivalent to division by the radix, the following equation represents the algorithm for transforming a fractional number from radix $a$ to radix $b$:

$$\frac{S}{r_a} + I_{-1}(r_a)^{-1} r_b = S + Z \bmod r_a \qquad (2)$$

Where most of the parameters are defined as above with regard to equation 1 and $I_{-1}(r_a)^{-1}$ = Weighted input or residue digit in fractional conversion.

It will be appreciated that equations 1 and 2 are applicable for conversions between all radices, the specific implementation being dependent on the specific radices involved.

Consider now the application of equation 1 to integral number conversions. For example, for a binary to decimal converter where $r_a = 2$ and $r_b = 10$, assuming the state of the machine is 7 and an input of 1 occurs:

$$\frac{(7)\ 2 + 1\ (2)^0}{10}$$

$$= \frac{14 + 1}{10}$$

$$= 1 + 5 \text{ mod } 10$$

Thus, an output $Z = 1$ is generated, and the resulting state of the machine is 5.

Similarly, for BCD or decimal to binary conversion where $r_a = 10$ and $r_b = 2$, assuming $S = 1$ and $I = 8$:

$$\frac{(1)\ 10 + 8(10)^0}{2}$$

$$= \frac{10 + 8}{2}$$

$$= 9 + 0 \text{ mod } 2$$

Thus, an output $Z = 9$ is generated, and the resulting state of the machine is 0.

It is thus appreciated that by assuming all possible states and inputs, state tables of automata for converting numbers in one radix to numbers in another radix for integral numbers may be developed in accordance with the precept of sequential logic theory as discussed in the said Kohavi and Hennie textbooks. For example, the state table (Table 1) for converting radix 2 to radix 10 is as follows:

TABLE 1

| PS(mod 10) | NS(mod 10) $I = 0$ | NS(mod 10) $I = 1$ | Z $I = 0$ | Z $I = 1$ |
|---|---|---|---|---|
| 0 mod 10 | 0 mod 10 | 1 mod 10 | 0 | 0 |
| 1 mod 10 | 2 mod 10 | 3 mod 10 | 0 | 0 |
| 2 mod 10 | 4 mod 10 | 5 mod 10 | 0 | 0 |
| 3 mod 10 | 6 mod 10 | 7 mod 10 | 0 | 0 |
| 4 mod 10 | 8 mod 10 | 9 mod 10 | 0 | 0 |
| 5 mod 10 | 0 mod 10 | 1 mod 10 | 1 | 1 |
| 6 mod 10 | 2 mod 10 | 3 mod 10 | 1 | 1 |
| 7 mod 10 | 4 mod 10 | 5 mod 10 | 1 | 1 |
| 8 mod 10 | 6 mod 10 | 7 mod 10 | 1 | 1 |
| 9 mod 10 | 8 mod 10 | 9 mod 10 | 1 | 1 | where in accordance with conventional sequential logic nomenclature PS = present state and NS = new state.

Similarly the state table (Table 2) for converting radix 10 to radix 2 is as follows:

TABLE 2

| PS(M2) | NS(Mod 2) $I=0$ | $I=1$ | $I=2$ | $I=3$ | $I=4$ | $I=5$ | $I=6$ | $I=7$ | $I=8$ | $I=9$ | Z 0 1 2 3 4 5 6 7 8 9 |
|---|---|---|---|---|---|---|---|---|---|---|---|
| 0Mod2 | 0M2 | 1M2 | 0M2 | 1M2 | 0M2 | 1M2 | 0M2 | 1M2 | 0M2 | 1M2 | 0 0 1 1 2 2 3 3 4 4 |
| 1Mod2 | 0M2 | 1M2 | 0M2 | 1M2 | 0M2 | 1M2 | 0M2 | 1M2 | 0M2 | 1M2 | 5 5 6 6 7 7 8 8 9 9 | where M is a convenient designation for "mod".

The state table (Table 3) for a radix 3 to radix 5 automaton is as follows:

TABLE 3

| PS(mod 5) | NS(mod 5) $I = 0$ | $I = 1$ | $I = 2$ | Z $I=0$ | $I=1$ | $I=2$ |
|---|---|---|---|---|---|---|
| 0 mod 5 | 0 mod 5 | 1 mod 5 | 2 mod 5 | 0 | 0 | 0 |
| 1 mod 5 | 3 mod 5 | 4 mod 5 | 0 mod 5 | 0 | 0 | 1 |
| 2 mod 5 | 1 mod 5 | 2 mod 5 | 3 mod 5 | 1 | 1 | 1 |
| 3 mod 5 | 4 mod 5 | 0 mod 5 | 1 mod 5 | 1 | 2 | 2 |
| 4 mod 5 | 2 mod 5 | 3 mod 5 | 4 mod 5 | 2 | 2 | 2 |

The state table (Table 4) for a radix 5 to radix 3 automata is as follows:

TABLE 4

| PS(M3) | NS(Mod 3) $I=0$ | $I=1$ | $I=2$ | $I=3$ | $I=4$ | Z $I=0$ | $I=1$ | $I=2$ | $I=3$ | $I=4$ |
|---|---|---|---|---|---|---|---|---|---|---|
| 0Mod3 | 0M3 | 1M3 | 2M3 | 0M3 | 1M3 | 0 | 0 | 0 | 1 | 1 |
| 1Mod3 | 2M3 | 0M3 | 1M3 | 2M3 | 0M3 | 1 | 2 | 2 | 2 | 3 |
| 2Mod3 | 1M3 | 2M3 | 0M3 | 1M3 | 2M3 | 3 | 3 | 4 | 4 | 4 |

Referring now to FIG. 1, the state diagram corresponding to the binary to decimal conversion of Table 1 is illustrated. Each state is represented by a circle with a letter designating the state shown therein as well as a legend indicating the numerical value of the state. The numerators of the legends associated with the leads represent the input to a stage in the designated state and the denominator of the legend represents the output from that stage, the associated line leading to the new state for the stage. Thus it is appreciated that the automaton associated with FIG. 1 is a 10 state device that changes from state to state in accordance with the diagram in response to the inputs as indicated and providing the associated indicated outputs. The nomenclature and interpretation of state diagrams and state tables are generally well known in sequential logic theory supra and will not be further described herein for brevity. It will be appreciated, however, that the state diagrams and state tables illustrated herein and derived from novel equations 1 and 2 above are themselves novel and provide the basis for the preferred embodiment of the invention to be described below.

Referring now to FIGS. 2, 3 and 4, state diagrams corresponding to Tables 2, 3 and 4 above with regard to integral number conversions from radix 10 to radix 2 (decimal or BCD to binary), radix 3 to radix 5 and radix 5 to radix 3 respectively are illustrated. Thus it is appreciated that by utilizing equation 1, state diagrams and state tables may be derived for converting integral numbers between any two radices.

By applying sequential logic theory as taught in the said Kohavi and Hennie textbooks to the state diagrams of FIGS. 1–4 in a manner well known to those skilled in the art, corresponding automata circuits may be derived to provide radix converters in accordance with the invention. The derivation of circuits from the state diagrams of FIGS. 1–4 is routine and the details thereof will not be described herein for brevity. Since the Moore output of each automaton is to represent a coefficient in the converted radix, the state assignment code is set equal to the desired Moore output thereby eliminating the necessity for the translation function $\lambda$ described above with regard to equations 1 and 2. By utilizing a standard J-K flip-flop excitation function and by utilization of appropriate "don't care" conditions, equations for converting radix 2 to radix 10 are as follows:

$J_1 = Q_2\overline{Q}_3\overline{Q}_4$            $K_1 = \overline{Q}_4$ $J_2 = Q_3 + Q_1\overline{Q}_4$         $K_2 = \overline{Q}_3 + \overline{Q}_4$ $J_3 = Q_1\overline{Q}_4 + \overline{Q}_1\overline{Q}_2Q_4$      $K_3 = \overline{Q}_2\overline{Q}_4 + Q_2Q_4$ $J_4 = X$                  $K_4 = \overline{X}$
$Z = Q_1 + Q_2(Q_3 + Q_4)$ Where: Moore output = BCD character = $f(Q_1, Q_2, Q_3, Q_4)$ Similarly, equations for converting radix 10 to radix 2 are:

$J = d$                    $K = \overline{d}$ $A = Qa + Qbc$             $B = \overline{Q}a + Q\overline{ac} + Q\overline{bc}$ $C = \overline{Q}b + Q\overline{bc} + b\overline{c}$    $D = \overline{Q}c + Q\overline{c}$ where:
Moore output = binary character = $f(Q)$
Mealy output = BCD character = $f(A,B,C,D)$ Input X = BCD character = $f(a,b,c,d)$ Referring now to FIG. 5, a 10 state automaton implemented in accordance with the above equations for converting radix 2 to radix 10 developed from the state diagram of FIG. 1 is illustrated. The automaton comprises four conventional J-K flip-flops 10 with J-K inputs and Q and $\overline{Q}$ outputs interconnected through combinational logic 11 to instrument the above given excitation equations utilizing standard NOR/NAND gates. The input to the automaton is applied on a terminal 12 and the residue Mealy output to the next stage is provided on a lead 13. The state of the automaton is provided on leads 14, the final state thereof providing the automaton Moore output representative of BCD coefficient in the transformed radix 10. Prior to a conversion a signal on a reset terminal 15 resets all of the flip-flops 10 to the zero state thus placing the automaton in its zero state a (FIG. 1). Clock pulses that are utilized for controlling the serial application of the input digits of the number to be converted in a conventional manner (not shown) are applied to a terminal 16 to sequence the flip-flops 10 from state to state in accordance with the combinational logic 11 as indicated by the state diagram of FIG. 1.

Figure 5:
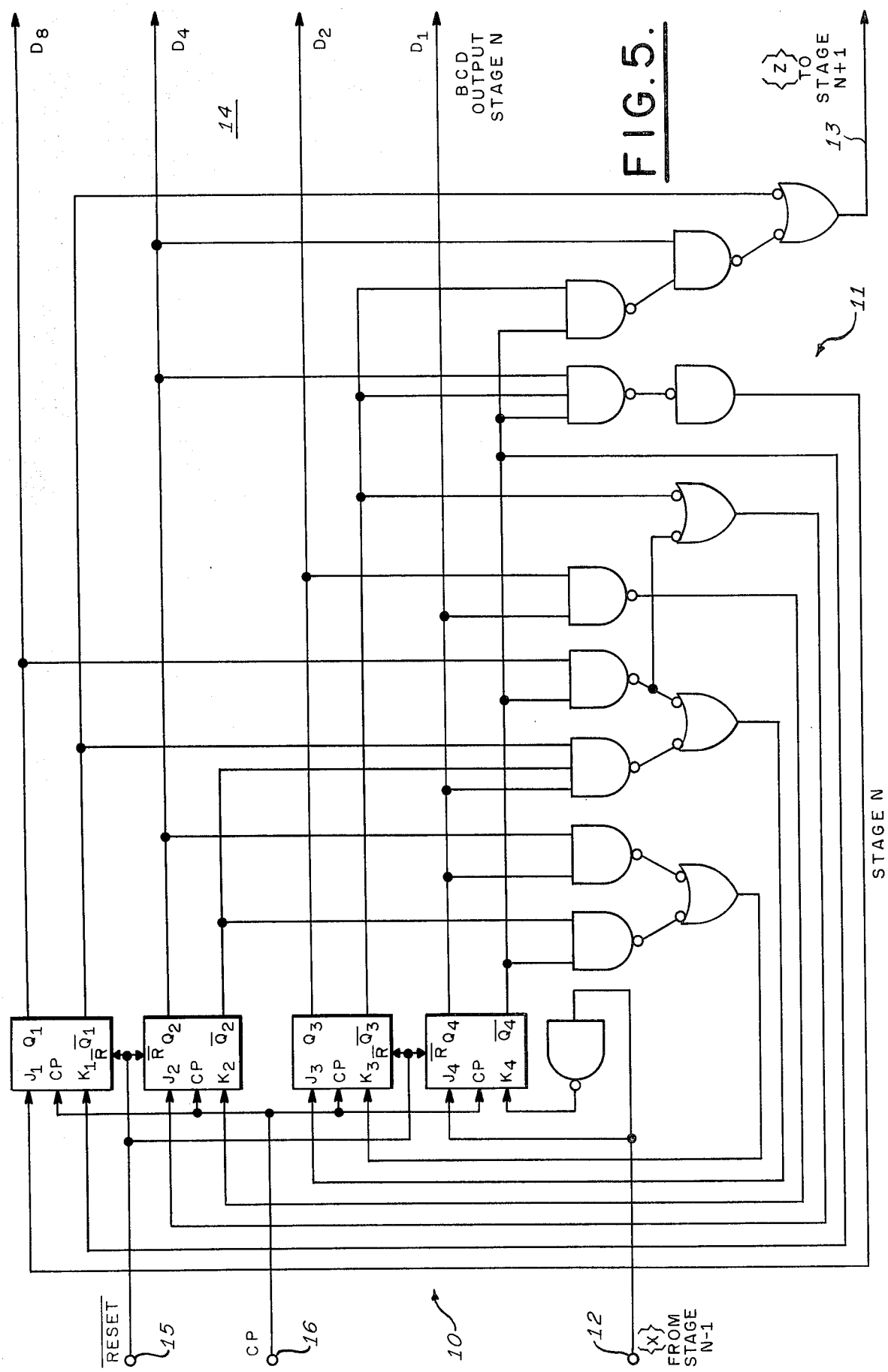
FIG. 5 is a logic block diagram of a radix 2 to radix 10 automaton in accordance with the state diagram of FIG. 1.
Figure 6:
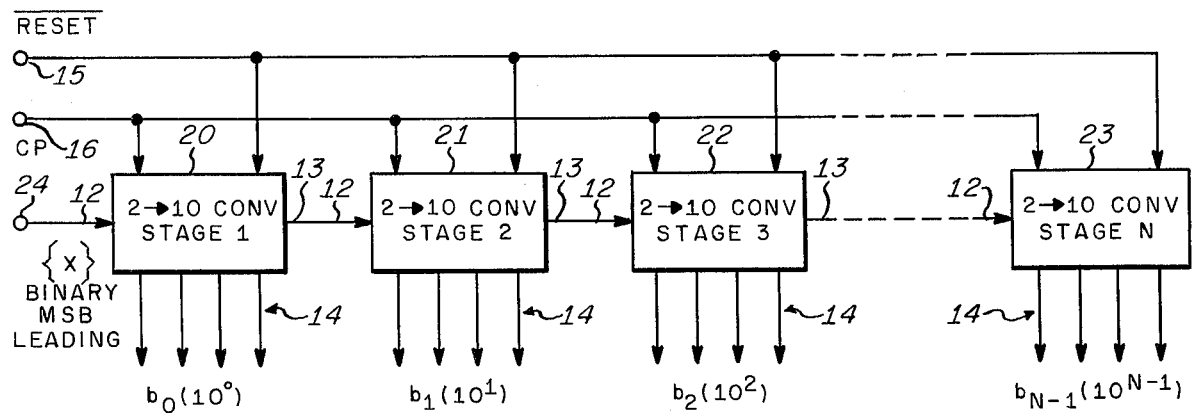
FIG. 6 is a schematic block diagram illustrating the interconnections of the automata of FIG. 5.

Referring now to FIG. 6 in which like reference numerals correspond to like elements with respect to FIG. 5, the interconnections of the automata of FIG. 5 are illustrated. Each of the blocks 20–23 comprises a circuit identical to that illustrated in FIG. 5. The binary to decimal radix converter of FIG. 6 is implemented to receive integrally valued binary numbers which are applied in serial fashion to a terminal 24 with the most significant digit of the number applied first.

The operation of the converter of FIGS. 5 and 6 will be explained with regard to a typical example in which the binary number (MSD) 1101011100010111 is converted into decimal. Since 16 bits are utilized, $2^{16}-1 \approx 64,000$ so that 5 converter stages such as that illustrated in FIG. 5 are required. Each sequential machine begins in the a-state (FIG. 1) and all stages operate synchronously. Exactly 16 clock times are utilized for the conversion, and after any clock time the conversion is exact relative to the accumulation of input data. The following Table 5 shows the timing sequence:

TABLE 5

| CP | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| $X_1$ | 1 | 1 | 0 | 1 | 0 | 1 | 1 | 1 | 0 | 0 | 0 | 1 | 0 | 1 | 1 | 1 |
| $S_1$ | a | b | d | g | d | g | d | h | f | a | a | a | b | c | f | b | d |
| $Z_1=X_2$ | 0 | 0 | 0 | 1 | 0 | 1 | 1 | 0 | 0 | 0 | 0 | 0 | 0 | 1 | 0 |
| $S_2$ | a | a | a | a | b | c | f | a | b | d | g | c | e | i | g | d | g |
| $Z_2=X_3$ | 0 | 0 | 0 | 0 | 0 | 0 | 1 | 0 | 0 | 0 | 1 | 0 | 0 | 1 | 1 | 0 |
| $S_3$ | a | a | a | a | a | a | a | b | c | e | i | h | e | i | h | f | a |
| $Z_3=X_4$ | 0 | 0 | 0 | 0 | 0 | 0 | 0 | 0 | 0 | 0 | 1 | 1 | 0 | 1 | 1 | 1 |
| $S_4$ | a | a | a | a | a | a | a | a | a | a | a | b | d | g | d | h | f |
| $Z_4=X_5$ | 0 | 0 | 0 | 0 | 0 | 0 | 0 | 0 | 0 | 0 | 0 | 0 | 0 | 1 | 0 | 1 |
| $S_5$ | a | a | a | a | a | a | a | a | a | a | a | a | a | a | b | c | f |
| $Z_5$ | 0 | 0 | 0 | 0 | 0 | 0 | 0 | 0 | 0 | 0 | 0 | 0 | 0 | 0 | 0 | 0 |

The respective final states of the machines are:

$S_f = ffagd$

= 55063 which is the decimal equivalent of the input number.

Referring now to FIG. 7, a two state automaton implemented in accordance with the J-K excitation equations given above for converting radix 10 to radix 2 developed from the state diagram of FIG. 2, is illustrated. The automaton comprises a conventional J-K flip-flop 30 with J and K inputs and Q and $\overline{Q}$ outputs and associated combination logic 31 responsive to the flip-flop 30 and instrumenting the above given excitation equations utilizing standard NOR/NAND gates. The input to the automaton is applied to the combination logic 31 on leads 32 as designated by the legends $a$, $b$, $c$, and $d$. The residue Mealy output to the next stage is provided by the combinational logic 31 on leads 33 carrying the signals designated as A, B, C and D. The state of the automaton is provided on a lead 34, the final state thereof providing the automaton Moore output representative of a binary coefficient in the transformed radix 2. Prior to a conversion a signal on a reset terminal 35 resets the flip-flop 30 to the zero state thus placing the automaton in its zero state a (FIG. 2). Clock pulses that are utilized for controlling the serial application of the input digits of the number to be converted in a conventional manner (not shown) are applied to a terminal 36 to sequence the flip-flop 30 from state to state in accordance with the combinational logic 31 as indicated by the state diagram of FIG. 2.

Figure 8:
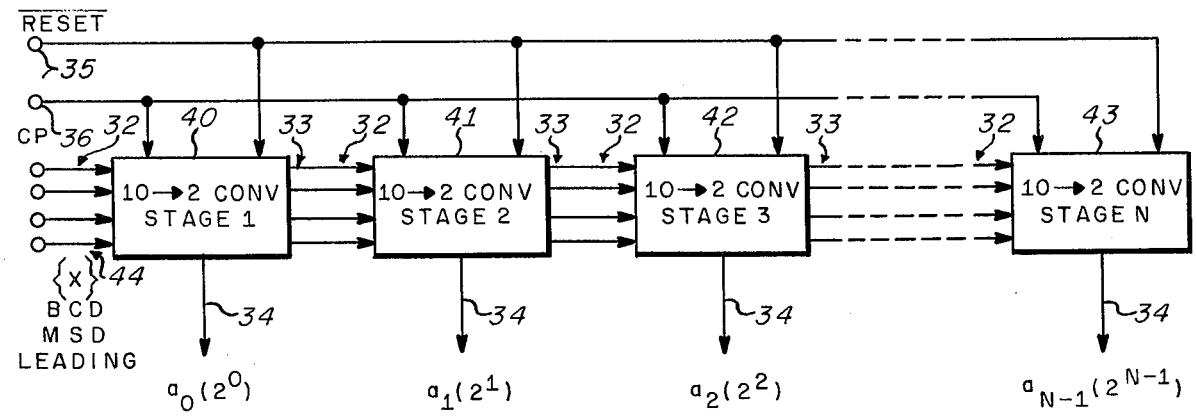
FIG. 8 is a schematic block diagram illustrating the interconnections of the automata of FIG. 7.

Referring now to FIG. 8 in which like reference numerals designate like elements with respect to FIG. 7, the inter-connections of the automata of FIG. 7 are illustrated. Each of the blocks 40–43 comprises a circuit identical to that illustrated in FIG. 7. The BCD or decimal to binary radix converter of FIG. 8 is implemented to receive integrally valued binary coded decimal numbers which are applied in serial fashion to terminals 44 with the most significant digit of the number applied first.

The operation of the converter of FIGS. 7 and 8 will be explained with regard to a typical example in which the decimal number 55063 is converted into binary. Since 16 binary digits are required to express this number, 16 stages such as that illustrated in FIG. 7 are required. Each sequential machine begins in the A-stat (FIG. 2) and all stages operate synchronously. Exactly five clock times are utilized for the conversion, and after any clock time the conversion is exact relative to the accumulation of input data. The following Table 6 shows the timing sequence:

TABLE 6

| CP | 1 | 2 | 3 | 4 | 5 |
|---|---|---|---|---|---|
| $X_1$ | 5 | 5 | 0 | 6 | 3 |
| $S_1$ | a | b | b | a | a | b |
| $Z_1=X_2$ | 2 | 7 | 5 | 3 | 1 |
| $S_2$ | a | a | b | b | b | b |
| $Z_2=X_3$ | 1 | 3 | 7 | 6 | 5 |
| $S_3$ | a | b | b | b | a | b |
| $Z_3=X_4$ | 0 | 6 | 8 | 8 | 2 |
| $S_4$ | a | a | a | a | a | a |
| $Z_4=X_5$ | 0 | 3 | 4 | 4 | 1 |
| $S_5$ | a | a | b | a | a | b |
| $Z_5=X_6$ | 0 | 1 | 7 | 2 | 0 |
| $S_6$ | a | a | b | b | a | a |
| $Z_6=X_7$ | 0 | 0 | 8 | 6 | 0 |
| $S_7$ | a | a | a | a | a | a |
| $Z_7=X_8$ | 0 | 0 | 4 | 3 | 0 |
| $S_8$ | a | a | a | a | b | a |
| $Z_8=X_9$ | 0 | 0 | 2 | 1 | 5 |
| $S_9$ | a | a | a | a | b | b |
| $Z_9=X_{10}$ | 0 | 0 | 1 | 0 | 7 |
| $S_{10}$ | a | a | a | a | a | b |
| $Z_{10}=X_{11}$ | 0 | 0 | 0 | 5 | 3 |
| $S_{11}$ | a | a | a | a | b | b |
| $Z_{11}=X_{12}$ | 0 | 0 | 0 | 2 | 6 |
| $S_{12}$ | a | a | a | a | a | a |
| $Z_{12}=X_{13}$ | 0 | 0 | 0 | 1 | 3 |
| $S_{13}$ | a | a | a | a | b | b |
| $Z_{13}=X_{14}$ | 0 | 0 | 0 | 0 | 6 |
| $S_{14}$ | a | a | a | a | a | a |
| $Z_{14}=X_{15}$ | 0 | 0 | 0 | 0 | 3 |
| $S_{15}$ | a | a | a | a | a | b |

TABLE 6-continued

| CP | 1 | 2 | 3 | 4 | 5 |
|---|---|---|---|---|---|
| $Z_{15}=X_{16}$ | 0 | 0 | 0 | 0 | 1 |
| $S_{16}$ | a | a | a | a | a | b |
| $Z_{16}$ | 0 | 0 | 0 | 0 | 0 |

The respective final states of the machines are:

$S_f=$ bbababbbaaababbb

= 1101011100010111 Which is the binary equivalent of the decimal input.

Figure 9:
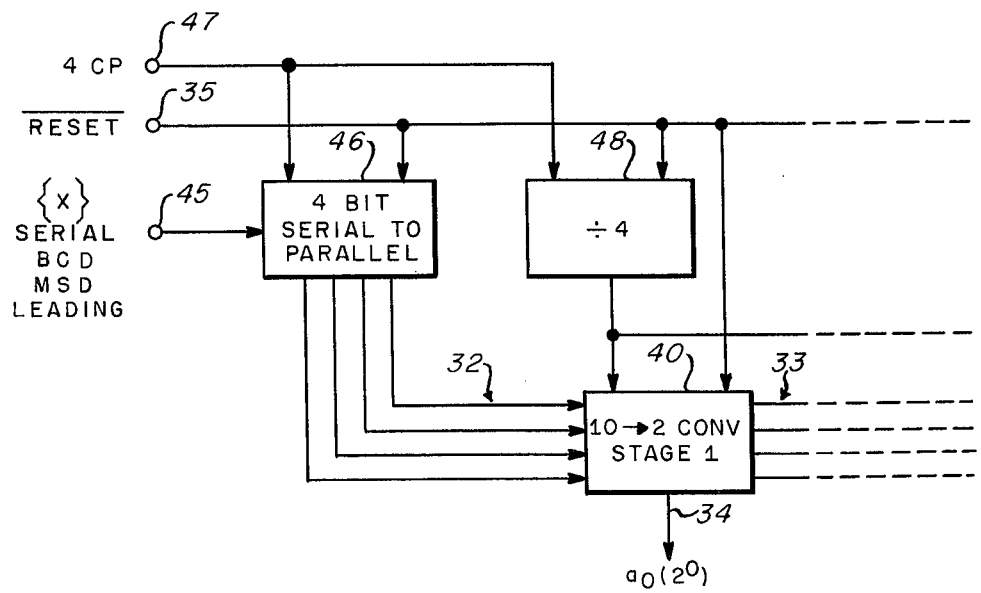
FIG. 9 is a schematic block diagram illustrating an alternative arrangement of FIG. 8.

Referring now to FIG. 9 in which like reference numerals designate like components with regard to FIG. 8 an alternative arrangement of FIG. 8 is illustrated. In FIG. 8, each BCD digit is applied to the terminals 44 in parallel. If the bits of the individual BCD digits are provided serially the arrangement of FIG. 9 may be utilized. The bit serial BCD digits are applied via a terminal 45 to a conventional four-bit serial to parallel converter 46. The four line output of the converter 46 is applied to the input 32 of the first automaton stage 40. Since the serial bits applied to the terminal 45 have a data rate four times greater than that of the input to the converter stage 40 as well as to the stages 41–43 (FIG. 8), a clock pulse signal of a frequency four times the normal clock pulse rate is applied to the converter 46 via a terminal 47. The clock pulse signal applied to the terminal 47 is also applied via a conventional divide by four circuit 48 to the converter stages 40–43 to perform the clocking operations described with regard to FIG. 8. It will be appreciated that although a serial to parallel conversion must be performed at the input to the converter of FIG. 9, the Mealy outputs of the stages 40–43 are already of the proper form within the converter chain itself.

Consider now the application of the above given equation 2 to fractional number conversions. For example, for a binary to decimal converter where $r_a=2$ and $r_b=10$, assuming the state of the machine is 7 and an input of 1 occurs:

$$\frac{7}{2} + 1\,(2)^{-1}\,10$$

$$= 3 + 1 \bmod 2 + 5 + 0 \bmod 2$$

$$= 8 + 1 \bmod 2$$

Thus, the new state of the machine is 8 and an output is 1 is generated.

Similarly for BCD or decimal to binary conversion where $r_a=10$, $r_b=2$, assuming $S=1$ and $I=8$:

$$\frac{1}{10} + 8(10)^{-1}\,2$$

$$= 0 + 1 \bmod 10 + 1 + 6 \bmod 10$$

$$+ 1 + 7 \bmod 10$$

Thus, the new state of the machine is 1 and the Mealy output to the next stage is 7.

In a manner similar to that described above with regard to integral number conversions, state tables of automata for converting numbers in one radix to numbers in another radix for fractional numbers may be developed. For example, the state tables (Tables 7–10) for converting radix 2 to radix 10 (BCD), radix 10 to radix 2, radix 3 to radix 5 and radix 5 to radix 3, are as follows respectively:

TABLE 7

| PS | NS I=0 | NS I=1 | Z(mod 2) I=0 | Z(mod 2) I=1 |
|---|---|---|---|---|
| 0 | 0 | 5 | 0 mod 2 | 0 mod 2 |
| 1 | 0 | 5 | 1 mod 2 | 1 mod 2 |
| 2 | 1 | 6 | 0 mod 2 | 0 mod 2 |
| 3 | 1 | 6 | 1 mod 2 | 1 mod 2 |
| 4 | 2 | 7 | 0 mod 2 | 0 mod 2 |
| 5 | 2 | 7 | 1 mod 2 | 1 mod 2 |
| 6 | 3 | 8 | 0 mod 2 | 0 mod 2 |
| 7 | 3 | 8 | 1 mod 2 | 1 mod 2 |
| 8 | 4 | 9 | 0 mod 2 | 0 mod 2 |
| 9 | 4 | 9 | 1 mod 2 | 1 mod 2 |

TABLE 8

| PS | NS 0 1 2 3 4 5 6 7 8 9 | I=0 | I=1 | I=2 | I=3 | I=4 | I=5 | I=6 | I=7 | I=8 | I=9 |
|---|---|---|---|---|---|---|---|---|---|---|---|
| | | | | | Z(Mod 10) | | | | | | |
| 0 | 0 0 0 0 0 1 1 1 1 1 | 0M10 | 2M10 | 4M10 | 6M10 | 8M10 | 0M10 | 2M10 | 4M10 | 6M10 | 8M10 |
| 1 | 0 0 0 0 0 1 1 1 1 1 | 1M10 | 3M10 | 5M10 | 7M10 | 9M10 | 1M10 | 3M10 | 5M10 | 7M10 | 9M10 |

TABLE 9

| PS | NS I=0 | NS I=1 | NS I=2 | Z(mod 3) I=0 | Z(mod 3) I=1 | Z(mod 3) I=2 |
|---|---|---|---|---|---|---|
| 0 | 0 | 1 | 3 | 0mod3 | 2mod3 | 1mod3 |
| 1 | 0 | 2 | 3 | 1mod3 | 0mod3 | 2mod3 |
| 2 | 0 | 2 | 4 | 2mod3 | 1mod3 | 0mod3 |
| 3 | 1 | 2 | 4 | 0mod3 | 2mod3 | 1mod3 |
| 4 | 1 | 3 | 4 | 1mod3 | 0mod3 | 2mod3 |

TABLE 10

| PS | NS I=0 | NS I=1 | NS I=2 | NS I=3 | Z(mod 5) I=0 | Z(mod 5) I=1 | Z(mod 5) I=2 | Z(mod 5) I=3 | Z(mod 5) I=4 |
|---|---|---|---|---|---|---|---|---|---|
| 0 | 0 | 0 | 1 | 1 | 2 | 0M5 | 3M5 | 1M5 | 4M5 | 2M5 |
| 1 | 0 | 0 | 1 | 2 | 2 | 1M5 | 4M5 | 2M5 | 0M5 | 3M5 |
| 2 | 0 | 1 | 1 | 2 | 2 | 2M5 | 0M5 | 3M5 | 1M5 | 4M5 |

Where: Moore output = BCD character = $f(Q_1, Q_2, Q_3, Q_4)$

Similarly equations for converting radix 10 to radix 2 are:

$$J = a + bc \pm bd \qquad K = \bar{J}$$
$$A = ad + \overline{bcd} \qquad B = a\bar{d} + \bar{b}c + cd$$
$$C = a\bar{d} + \overline{abd} + bc\bar{d} \qquad D = Q$$

Figure 10:
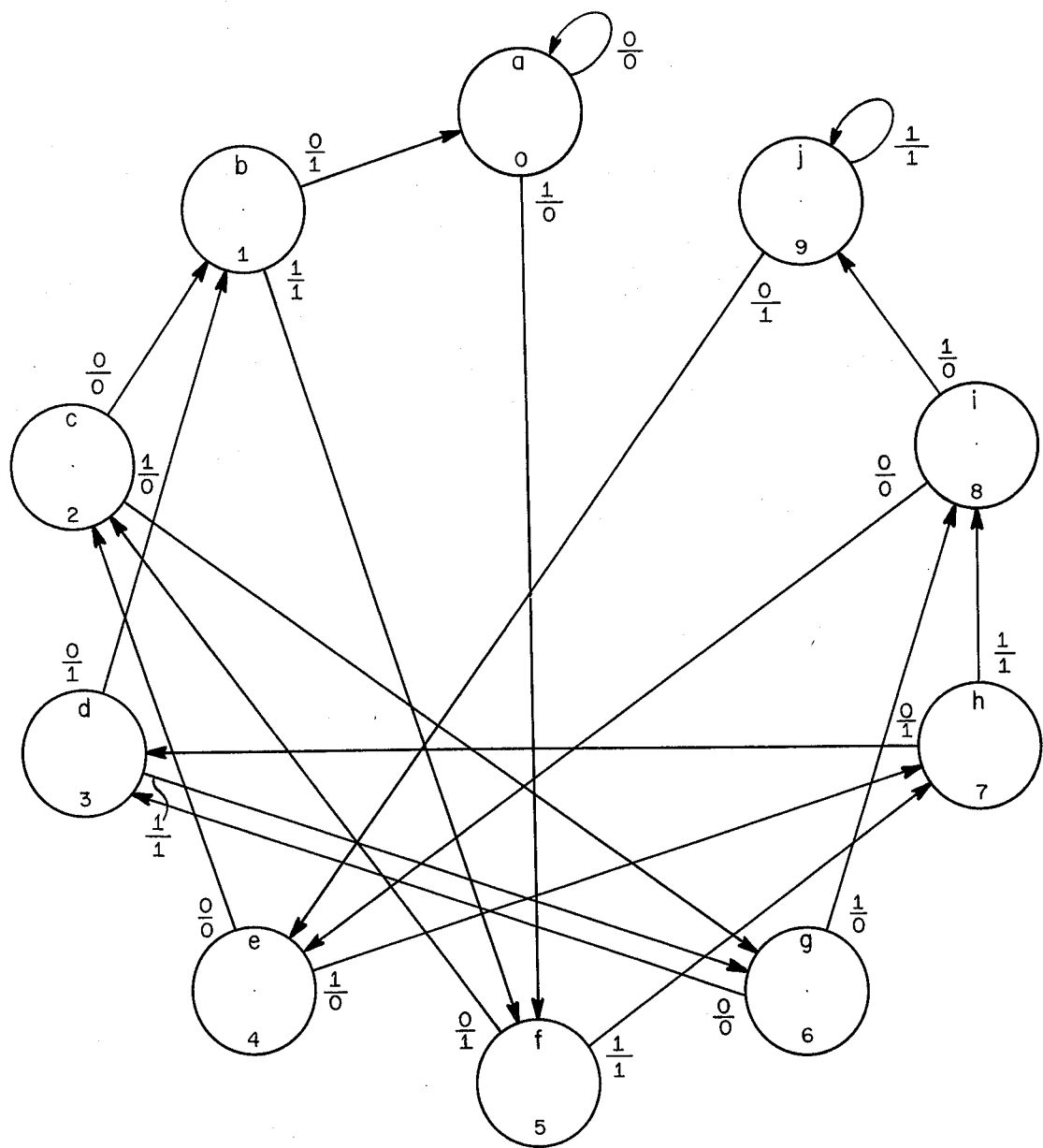
FIG. 10 is a state diagram for a radix 2 to radix 10 automaton for fractional number conversion.

Where:
Moore output = binary character = $f(Q)$
Mealy output = BCD character = $f(A,B,C,D)$
Input $X$ = BCD character = $f(a,b,c,d)$ Referring now to FIG. 14, a 10 state automaton implemented in accordance with the above equations for converting radix 2 to radix 10 developed from the state diagram of FIG. 10 is illustrated: The automaton comprises four conventional J-K flip-flops 50 with J-K inputs and Q and $\bar{Q}$ outputs interconnected through combinational logic fractionally to instrument the above given excitation equations utilizing standard NOR/-NAND gates. The input of the automaton is applied on a terminal 52 and the residue Mealy output to the next stage is provided on a lead 53. The state of the automaton is provided on leads 54, the final state thereof providing the automaton Moore output representative of a BCD coefficient in the transformed radix 10. Prior to a conversion, a signal on a reset terminal 55 resets all of the flip-flops 50 to the zero state thus placing the automaton in its zero state a (FIG. 10). Clock pulses that are utilized for controlling the serial application of the input digits of the number to be converted in a conventional manner (not shown) are applied to a terminal 56 to sequence the flip-flops 50 from state to state in accordance with the combination logic 51 as indicated by the state diagram of FIG. 10.

Figure 14:
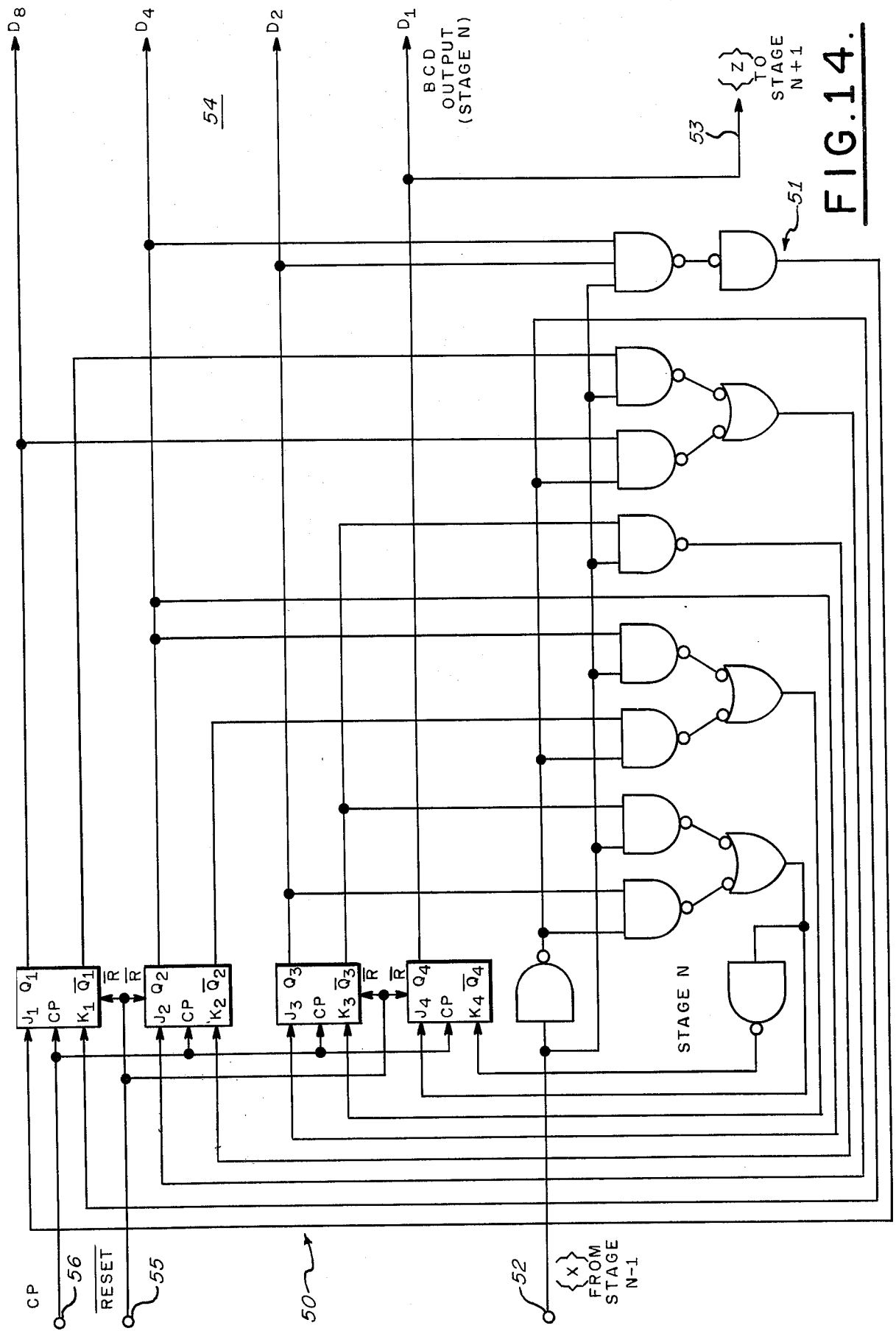
FIG. 14 is a logic block diagram of a radix 2 to radix 10 automaton in accordance with the state diagram of FIG. 10.
Figure 15:
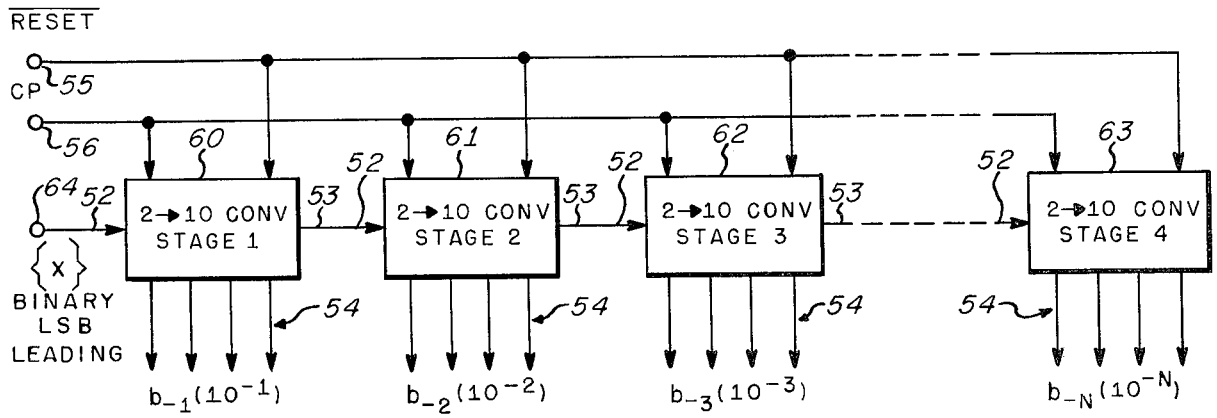
FIG. 15 is a schematic block diagram illustrating the inter-connections of the automata of FIG. 14.

Referring now to FIG. 15 in which like reference numerals designate like elements with regard to FIG. 14, the inter-connections of the automata of FIG. 14 are illustrated. Each of the blocks 60–63 comprises a circuit identical to that illustrated in FIG. 14. The binary to decimal radix converter of FIG. 15 is implemented to receive frictionally valued binary numbers which are applied in serial fashion to a terminal 64 with the least significant digit of the number applied first.

The operation of the converter of FIGS. 14 and 15 will be explained with regard to a typical example in which the binary number 0.101101011 is converted In a manner similar to that described above with regard to integral number conversions, the state diagrams corresponding to the Tables 7–10 are derived and are illustrated in FIGS. 10–13 respectively. Thus, it is appreciated from the foregoing that by utilizing equation 2 given above, state diagrams and state tables may be derived for converting fractional numbers between any two radices.

Again as described above with regard to the integral number conversion, automata circuits may be derived corresponding to the state diagrams of FIGS. 10–13 to provide radix converters in accordance with the invention. As described above, the state assignment code is set equal to the converted digit and hence the Moore output becomes the state assignment itself. Again, by utilizing a standard J-K flip-flop excitation function and by utilization of appropriate "don't care" conditions, equations for converting radix 2 to radix 10 are as follows:

$$J_1 = XQ_2Q_3 \qquad K_1 = \bar{X}$$
$$J_2 = \bar{X}Q_1 + X\bar{Q}_1 \qquad K_2 = \bar{X} + Q_3 \qquad Z = Q_4$$
$$J_3 = Q_2 \qquad K_3 = \overline{XQ_2} + XQ_2$$
$$J_4 = \bar{X}Q_3 + X\bar{Q}_3 \qquad K_4 = \bar{J}_4$$

into decimal. Exactly nine clock times are utilized for the conversion and after any clock time the conversion is exact relative to the accumulation of input data. The number of converter stages depends upon the desired accuracy but since in this example the conversion is exact, nine stages are required. Each sequential machine begins in the a-state (FIG. 10) and all stages operate synchronously with the least significant digit applied first to the converter chain input. The following table 11 shows the timing sequence:

TABLE 11

| CP | 1 | 2 | 3 | 4 | 5 | 6 | 7 | 8 | 9 |
|---|---|---|---|---|---|---|---|---|---|
| $X_1$ | 1 | 1 | 0 | 1 | 0 | 1 | 1 | 0 | 1 |
| $S_1$ | a | f | h | d | g | d | g | i | e | h |
| $Z_1=X_2$ | 0 | 1 | 1 | 1 | 0 | 1 | 0 | 0 | 0 |
| $S_2$ | a | a | f | h | i | e | h | d | b | a |
| $Z_2=X_3$ | 0 | 0 | 1 | 1 | 0 | 0 | 1 | 1 | 1 |
| $S_3$ | a | a | a | f | h | d | b | f | h | i |
| $Z_3=X_4$ | 0 | 0 | 0 | 1 | 1 | 1 | 1 | 1 | 1 |
| $S_4$ | a | a | a | a | f | h | i | j | j | j |
| $Z_4=X_5$ | 0 | 0 | 0 | 0 | 1 | 1 | 0 | 1 | 1 |
| $S_5$ | a | a | a | a | a | f | h | d | g | i |
| $Z_5=X_6$ | 0 | 0 | 0 | 0 | 0 | 1 | 1 | 1 | 0 |
| $S_6$ | a | a | a | a | a | a | f | h | i | e |
| $Z_6=X_7$ | 0 | 0 | 0 | 0 | 0 | 0 | 1 | 1 | 0 |
| $S_7$ | a | a | a | a | a | a | a | f | h | d |
| $Z_7=X_8$ | 0 | 0 | 0 | 0 | 0 | 0 | 0 | 1 | 1 |
| $S_8$ | a | a | a | a | a | a | a | a | f | h |
| $Z_8=X_9$ | 0 | 0 | 0 | 0 | 0 | 0 | 0 | 0 | 1 |
| $S_9$ | a | a | a | a | a | a | a | a | f |
| $Z_9$ | 0 | 0 | 0 | 0 | 0 | 0 | 0 | 0 | 0 |

The respective final states of the machines are:

$S_f$ = haijiedhf

= 0.708984375 which is the decimal equivalent of the input number.

Figure 11:
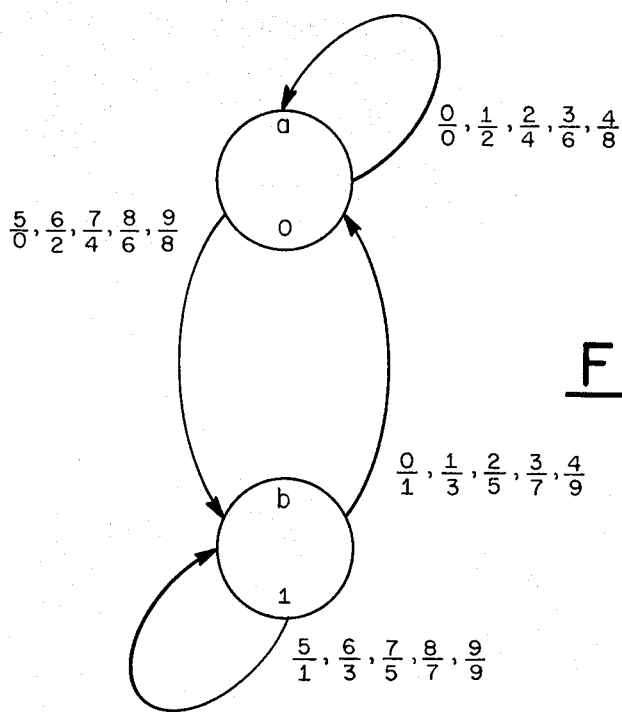
FIG. 11 is a state diagram for a radix 10 to radix 2 automaton for fractional number conversion.
Figure 12:
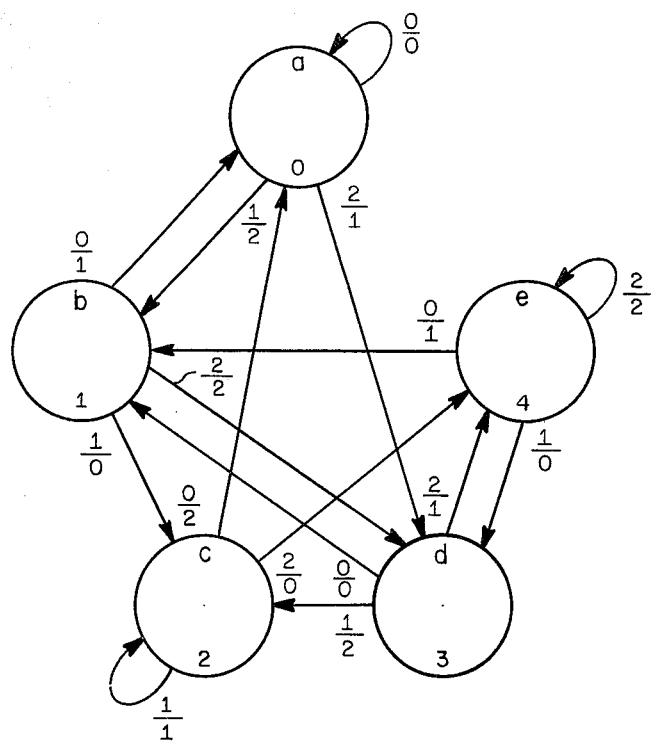
FIG. 12 is a state diagram for a radix 3 to radix 5 automaton for fractional number conversion.
Figure 13:
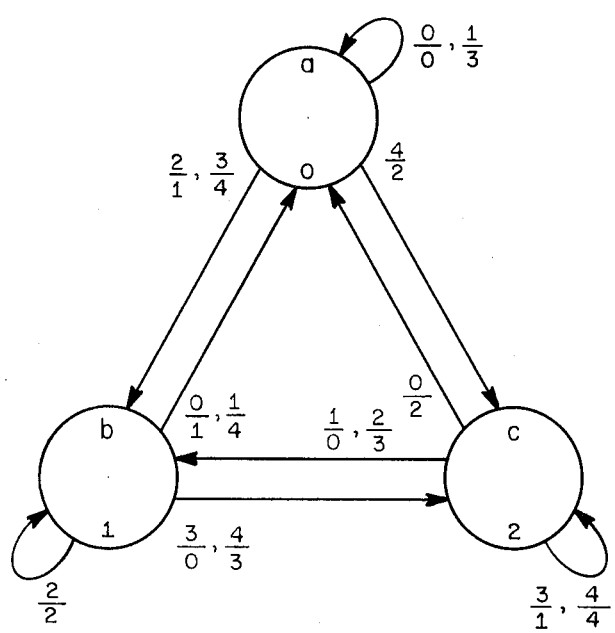
FIG. 13 is a state diagram for a radix 5 to radix 3 automaton for fractional number conversion.
Figure 16:
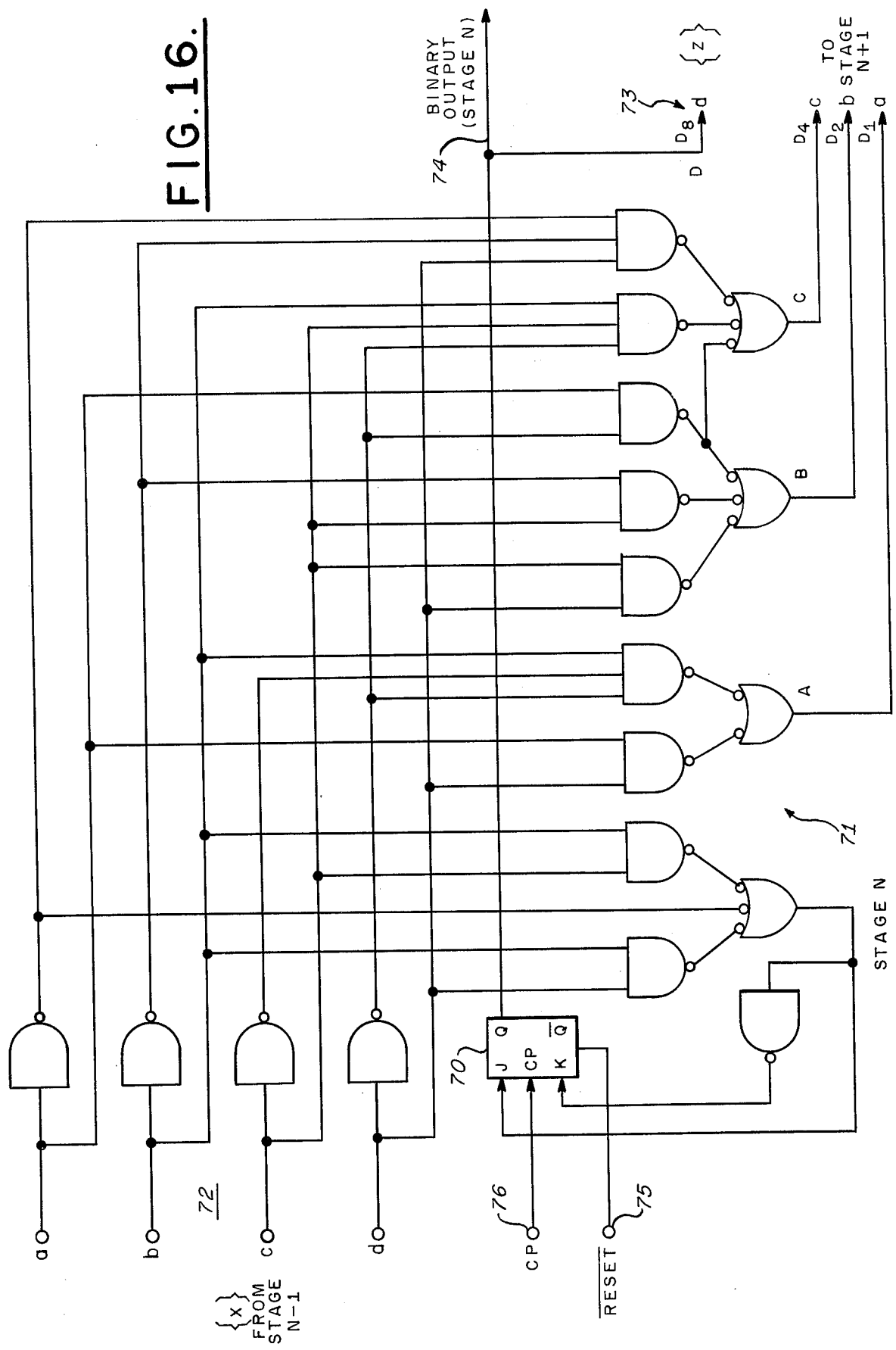
FIG. 16 is a logic block diagram of a radix 10 to radix 2 automaton in accordance with the state diagram of FIG. 11.

Referring now to FIG. 16, a 2-state automaton implemented in accordance with the above given J-K excitation equations for converting radix 10 to radix 2 developed from the state diagram of FIG. 11 is illustrated. The automaton comprises a conventional J-K flip-flop 70 with J and K inputs and Q and $\bar{Q}$ outputs and associated conbinational logic 71 to instrument the above given excitation equations utilizing standard NOR/-NAND gates. The input to the automaton is applied to the combinational logic 71 on terminals 72 as designated by the legends a, b, c, and d. The residue Mealy output to the next stage is provided on leads 73 carrying the signals designated as A, B, C and D. The state of the automaton is provided on a lead 74, the final state thereof providing the automaton Moore output representative of a binary coefficient in the transformed radix 2. Prior to a conversion a signal on a reset terminal 75 resets the flip-flop 70 to the zero state thus placing the automaton in its zero state a (FIG. 11). Clock pulses that are utilized for controlling the serial application of the input digits of the number to be converted in a conventional manner (not shown) are applied to a terminal 76 to sequence the flip-flop 70 from state to state in accordance with the combinational logic 71 as indicated by the state diagram of FIG. 11.

Figure 17:
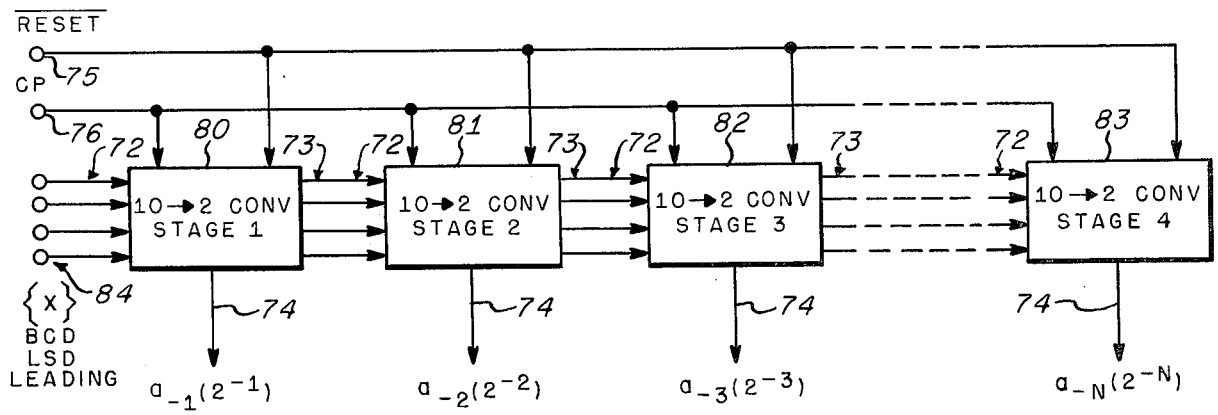
FIG. 17 is a schematic block diagram illustrating the interconnections of the automata of FIG. 16.

Referring now to FIG. 17 in which like reference numerals designate like elements with respect to FIG. 16, the inner-connections of the automata of FIG. 16 are illustrated. Each of the blocks 80–83 comprises a circuit identical to that illustrated in FIG. 16. The BCD or decimal to binary radix converter of FIG. 17 is implemented to receive fractionally valued BCD or decimal numbers which are applied in serial fashion to terminals 84 with the least significant digit of the number applied first.

Figure 18:
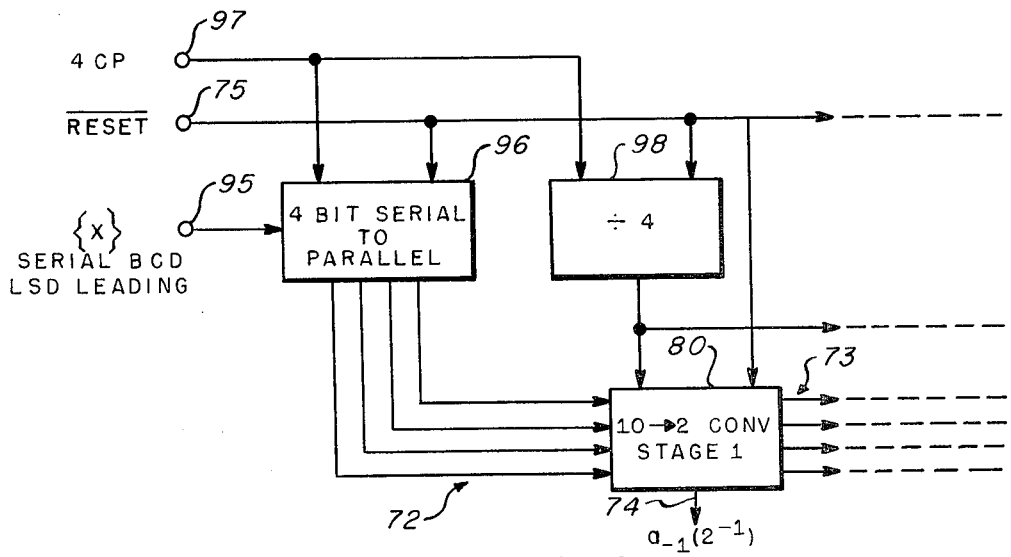
FIG. 18 is a schematic block diagram illustrating an alternative arrangement of FIG. 17.

Referring now to FIG. 18 in which like reference numerals indicate like components with regard to FIG. 17, an alternative arrangement of FIG. 17 is illustrated. The structure and operation of the components 95–98 are identical to the components 45–48 respectively of FIG. 9 and will not be further described herein for brevity.

The operation of the converter of FIGS. 16–18 will be explained with regard to a typical example in which the decimal numbr 0.708984375 is converted into binary. In a similar manner to that of the reverse conversion example given above, exactly nine clock times are required for the transformation and the number of converter stages depends upon the accuracy desired. Since in this example the conversion is exact, nine stages are utilized. Each sequential machine begins in that a state (FIG. 11) and all stages operate synchronously. After any clock time the conversion is exact relative to the accumulation of input data. The following Table 12 shows the timing sequence:

TABLE 12

| CP | 1 | 2 | 3 | 4 | 5 | 6 | 7 | 8 | 9 |
|---|---|---|---|---|---|---|---|---|---|
| $X_1$ | 5 | 7 | 3 | 4 | 8 | 9 | 8 | 0 | 7 |
| $S_1$ | a | b | b | a | a | b | b | b | a | b |
| $Z_1=X_2$ | 0 | 5 | 7 | 8 | 6 | 9 | 7 | 1 | 4 |
| $S_2$ | a | a | b | b | b | b | b | b | a | a |
| $Z_2=X_3$ | 0 | 0 | 5 | 7 | 3 | 9 | 5 | 3 | 8 |
| $S_3$ | a | a | a | b | b | a | b | b | a | b |
| $Z_3=X_4$ | 0 | 0 | 0 | 5 | 7 | 8 | 1 | 7 | 6 |
| $S_4$ | a | a | a | a | b | b | b | a | b | b |
| $Z_4=X_5$ | 0 | 0 | 0 | 0 | 5 | 7 | 3 | 4 | 3 |
| $S_5$ | a | a | a | a | a | b | b | a | a | a |
| $Z_5=X_6$ | 0 | 0 | 0 | 0 | 0 | 5 | 7 | 8 | 6 |
| $S_6$ | a | a | a | a | a | a | b | b | b | b |
| $Z_6=X_7$ | 0 | 0 | 0 | 0 | 0 | 0 | 5 | 7 | 3 |
| $S_7$ | a | a | a | a | a | a | a | b | b | a |
| $Z_7=X_8$ | 0 | 0 | 0 | 0 | 0 | 0 | 0 | 5 | 7 |
| $S_8$ | a | a | a | a | a | a | a | a | b | b |
| $Z_8=X_9$ | 0 | 0 | 0 | 0 | 0 | 0 | 0 | 0 | 5 |
| $S_9$ | a | a | a | a | a | a | a | a | a | b |
| $Z_9$ | 0 | 0 | 0 | 0 | 0 | 0 | 0 | 0 | 0 |

The respective final states of the machines are:

$S_f$ = babbababb

= 0.101101011 which is the binary equivalent of the input number.

The operation of the converter in FIGS. 16, 17 and 18 will be further explained with regard to another example in which the decimal number 0.7 is converted into binary. It is appreciated that only one clock time is required and the conversion can be as accurate as desired in accordance with the number of cascade connected automata utilized. Again each sequential machine begins in the a state (FIG. 11) and all stages operate synchronously. The following table 13 shows the timing sequence for the conversion:

TABLE 13

| CP | 1 |
|---|---|
| $X_1$ | 7 |
| $S_1$ | a b |
| $Z_1=X_2$ | 4 |
| $S_2$ | a a |
| $Z_2=X_3$ | 8 |
| $S_3$ | a b |
| $Z_3=X_4$ | 6 |
| $S_4$ | a b |
| $Z_4=X_5$ | 2 |
| $S_5$ | a a |
| $Z_5=X_6$ | 4 |

TABLE 13-continued

| CP | 1 |
|---|---|

The respective final states of the machines are:

$S_f$ = babbaabba(aaba) ... (abba) ...

= 0.101100110(0110)...(0110)... which is the binary equivalent of the input number.

Although the above described converters have been explained in terms of positive number conversions, it will be appreciated that negative numbers may also be transformed. The above described apparatus may convert numbers that are in absolute magnitude and sign format in the manner described above. However, the apparatus may also be utilized to transform negative numbers in radix complement format. In this event the converter will provide the transformed number in radix complement format. It will be appreciated, however, that the sign digit must be trapped and separately displayed and should not be permitted to enter the conversion chain.

The operation of the above described converters with regard to negative numbers will be explained via a typical example with regard to the decimal to binary converter of FIGS. 16–18 in which the decimal number −0.828125 is converted into binary. The radix complement of the number is 0.171875 and the conversion sequence is shown in the following Table 14:

TABLE 14

| CP | 1 | 2 | 3 | 4 | 5 | 6 |
|---|---|---|---|---|---|---|
| $X_1$ | 5 | 7 | 8 | 1 | 7 | 1 |
| $S_1$ | a | b | b | b | a | b | a |
| $Z_1=X_2$ | 0 | 5 | 7 | 3 | 4 | 3 |
| $S_2$ | a | a | b | b | a | a | a |
| $Z_2=X_3$ | 0 | 0 | 5 | 7 | 8 | 6 |
| $S_3$ | a | a | a | b | b | b | b |
| $Z_3=X_4$ | 0 | 0 | 0 | 5 | 7 | 3 |
| $S_4$ | a | a | a | a | b | b | a |
| $Z_4=X_5$ | 0 | 0 | 0 | 0 | 5 | 7 |
| $S_5$ | a | a | a | a | a | b | b |
| $Z_5=X_6$ | 0 | 0 | 0 | 0 | 0 | 5 |
| $S_6$ | a | a | a | a | a | a | b |
| $Z_6$ | 0 | 0 | 0 | 0 | 0 | 0 |

The respective final states of the machines are:

$S_f$ = aababb

= −0.001011 which is the complemented binary transform.

As stated above, the conversion relative to the instantaneous input data is exact at the end of each clock time. This is illustrated in the following Table 15 by a pulse by pulse analysis of the sequence for the example given above with regard to FIGS. 16–18 where the decimal number 0.708984375 is converted into binary.

TABLE 15

| CP | Accumulated input | Conversion |
|---|---|---|
| 0 | 0.0 | 0.000000000 |
| 1 | 0.5 | 0.100000000 |
| 2 | 0.75 | 0.110000000 |
| 3 | 0.375 | 0.011000000 |
| 4 | 0.4375 | 0.011100000 |

TABLE 15-continued

| CP | Accumulated input | Conversion |
|---|---|---|
| 5 | 0.84375 | 0.110110000 |
| 6 | 0.984375 | 0.111111000 |
| 7 | 0.8984375 | 0.111001100 |
| 8 | 0.08984375 | 0.000101110 |
| 9 | 0.708984375 | 0.101101011 |

Thus it is appreciated that the transformation relative to the input sequence of digits is exact at each instant of time with all the transformed digits simultaneously available.

It is furthermore appreciated that identical modular logic circuits may be utilized and connected in cascade fashion as described to transform a number from one radix to another on a digit by digit basis. Each converter instrumented in accordance with the invention is independent of input word length and for fractional number conversion any desired accuracy may be obtained merely by the addition of further modular logic circuits to the chain. By the foregoing the process of radix conversion is related to sequential logic machine state with Mealy and Moore outputs within the discipline of sequential logic theory as generally explained in the said Kohavi and Hennie textbooks.

It is further appreciated that accuracy is a function of the converter chain length with any number of converter modules being cascaded without modifying the basic converter. Only one clock time per input digit is required for the transformation and the prior art requirement for high speed clocks for time subdivision is obviated. If the decimal quantity 0.7 is entered into a converter chain comprising ten identical automata, then within one clock time the simultaneous binary output 0.1011001100 is generated. If fifteen sequential machines had been interconnected, then the simultaneous binary output would have been 0.101100110011001. Transformation is exact to within the summation of the remaining digits from $2^{-16}$ to $2^{-\infty}$. If at this time a second digit enters the converter — 0.47 — then the output at the second clock time would be 0.0111100001 which is equivalent to 0.4697265625. As explained above, greater accuracy is achieved merely by increasing the length of the converter chain.

Thus it is appreciated that if converters in accordance with the present invention as described above are installed either at the computer or at the data panel, the BCD data from the panel would be transformed directly into binary code and would be available to the computer when the last digit has been transferred. Conversely, the binary data would have been converted and displayed in decimal form as soon as the last bit had been transferred from the computer to the panel.

Although implementations of the invention were described above in terms of binary and decimal converters, it will be appreciated that by utilizing the precepts given above other equations may be readily derived resulting in other implementations. It is furthermore appreciated that with regard to the binary and decimal converters other excitation equations may be derived utilizing sequential logic theory as described in the said Kohavi and Hennie textbooks to provide differently configured binary and decimal converters. Furthermore, other flip-flop types such as R-S and D-flip-flops may be utilized with appropriate excitation functions to implement converters in accordance with the invention.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. Apparatus for converting number representations from one radix to another comprising a plurality of automaton circuits each having an input, a Mealy output and a Moore output, each said automaton circuit being instrumented to operate in accordance with the equation:

$$\frac{(S)\, r_a + I_0(r_a)^0}{r_b} = Z + S \bmod r_b$$

where
$S$ = Present state of said automaton circuit
$S$ = Next state of said automaton circuit
$r_a$ = Current radix of said number representation
$r_b$ = Desired radix of said number representation
$Z$ = Said Mealy output of said automaton circuit
$I_0(r_a)^0$ = Weighted input digit of said number representation
$S_f$ = Final state of said automaton circuit,
said final state of said automaton circuit providing said Moore output representation of a digit of said number representation in said desired radix,
said automaton circuits being coupled in cascade with said input digits of said number representation being applied in serial fashion to the input of one of said automaton circuits and with the input of each of the remaining of said automaton circuits being coupled to the Mealy output of the preceding one of said automaton circuits,
each said automaton circuit comprising a device having $r_b$ stable states.

2. The apparatus of claim 1 in which said apparatus comprises a binary to BCD converter for integrally valued number representations with said input digits being applied most significant digit first, each said automaton circuit being a ten-state device comprising
four J-K flip-flops each having a J and a K input and a Q and a $\overline{Q}$ output, and
a combinational logic circuit connecting said outputs of said J-K flip-flops to the inputs thereof in accordance with the equations:

$J_1 = Q_2\overline{Q}_3\overline{Q}_4$
$J_2 = Q_3 + Q_1\overline{Q}_4$
$J_3 = Q_1\overline{Q}_4 + \overline{Q}_1Q_2Q_4$
$J_4 = X$
$Z = Q_1 + Q_2(Q_3 + Q_4)$ $K_1 = \overline{Q}_4$
$K_2 = \overline{Q}_3 + \overline{Q}_4$
$K_3 = \overline{Q}_2Q_4 + Q_2Q_4$
$K_4 = \overline{X}$ where
$X$ = said input to said automaton circuit and said Moore output = BCD output digit = $f(Q_1, Q_2, Q_3, Q_4)$.

3. The apparatus of claim 1 in which said apparatus comprises a BCD to binary converter for integrally valued number representations with said input digits being applied most significant digit first, each said automaton circuit being a two-state device comprising, a J-K flip-flop having a J and a K input and a Q and a $\overline{Q}$ output, and
a combinational logic circuit responsive to said input of said automaton circuit and to said outputs of said J-K flip-flops for providing signals to said J and K inputs of said J-K flip-flop and for providing said Mealy output of said automaton circuit in accordance with the equations $J = d$
$A = Qa + Qbc$
$C = Qb + Qbc + bc$ $K = \overline{d}$
$B = Qa + Q\overline{ac} + Q\overline{bc}$
$D = \overline{Qc} + Q\overline{c}$ where:
said Moore output = binary output digit = $f(Q)$
said Mealy output = BCD digit = $f(A, B, C, D)$
said Input to said automaton circuit = BCD digit = $f(a, b, c, d)$.

4. Apparatus for converting number representations from one radix to another comprising a plurality of automaton circuits eacch having an input, a Mealy ouput and a Moore output, said automaton circuit being instrumented to operate in accordance with the equation:

$$\frac{S}{r_a} + I_{-1}\,(r_a)^{-1}\, r_b = S + Z \bmod r_a$$

where:
$S$ = Present state of said automaton circuit
$S$ = Next state of said automaton circuit
$r_a$ = Current radix of said number representation
$r_b$ = Desired radix of said number representation
$Z$ = Said Mealy output of said automaton circuit
$I_{-1}(r_a)^{-1}$ = Weighted input digit of said number representation
$S_f$ = Final state of said automaton circuit,
said final state of said automaton circuit providing said Moore output representative of a digit of said number representation in said desired radix,
said automaton circuits being coupled in cascade with said input digits of said number representations being applied in serial fashion to the input of one of said automaton circuits and with the input of each of the remaining of said automaton circuits being coupled to the Mealy output of the preceding one of said automaton circuits,
each said automaton circuit comprising a device having $r_b$ stable states.

5. The apparatus of claim 4 in which said apparatus comprises a binary to BCD converter for fractionally valued number representations with said input digits being applied least significant digit first, each said automaton circuit being a ten-state device comprising,
four J-K flip-flops each having a J and a K input and a Q and a $\overline{Q}$ output, and
a combinational logic circuit connecting said outputs of said J-K flip-flops to the inputs thereof in accordance with the equations $J_1 = XQ_2Q_3$
$J_2 = \overline{X}Q_1 + X\overline{Q}_1$
$J_3 = Q_2$
$J_4 = \overline{X}Q_3 + X\overline{Q}_3$
$Z = Q_4$ $K_1 = \overline{X}$
$K_2 = \overline{X} + Q_3$
$K_3 = \overline{X}Q_2 + XQ_2$
$K_4 = J_4$ where $x$ = said input to said automaton circuit and said Moore output = $BCD$ output digit = $f(Q_1, Q_2, Q_3, Q_4)$.

6. The apparatus of claim 4 in which said apparatus comprises $BCD$ to binary converter for fractionally valued number representations with said input digits being applied least significant digit first, each said automaton circuit being a two-state device comprising, a J-K flip-flop having a J and a K input and a Q and a $\overline{Q}$ output, and a combinational logic circuit responsive to said input of said automaton circuit for providing signals to said J and K inputs of said J-K flip-flop and for providing said Mealy output of said automaton circuit in accordance with the equations:

$J = a + bc + bd$
$A = ad + b\overline{cd}$
$C = a\overline{d} + \overline{a}bd + bc\overline{d}$
$K = \overline{J}$
$B = a\overline{d} + \overline{b}c + cd$
$D = Q$ where:
said Moore output = binary output digit = $f(Q)$
said Mealy output = $BCD$ digit = $f(A,B,C,D)$
said Input to said automaton circuit = $BCD$ digit = $f(a,b,c,d)$.

* * * * *